(12) United States Patent
Voelkl et al.

(10) Patent No.: US 9,658,952 B2
(45) Date of Patent: May 23, 2017

(54) TECHNIQUE FOR CONTROLLING MEMORY ACCESSES

(75) Inventors: Juergen Voelkl, Nürnberg (DE); Winfried Wolff, Nürnberg (DE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 129 days.

(21) Appl. No.: 14/419,942

(22) PCT Filed: Aug. 6, 2012

(86) PCT No.: PCT/EP2012/003358
§ 371 (c)(1),
(2), (4) Date: Feb. 6, 2015

(87) PCT Pub. No.: WO2014/023316
PCT Pub. Date: Feb. 13, 2014

(65) Prior Publication Data
US 2015/0178185 A1 Jun. 25, 2015

(51) Int. Cl.
*G06F 12/02* (2006.01)
*G11C 7/10* (2006.01)
*G06F 13/16* (2006.01)

(52) U.S. Cl.
CPC ........ *G06F 12/023* (2013.01); *G06F 13/1663* (2013.01); *G11C 7/1075* (2013.01); *G06F 2212/1044* (2013.01)

(58) Field of Classification Search
CPC .......... G06F 1/12; G06F 5/065; G06F 12/023; G06F 13/1663; G06F 13/1673; G06F 2212/1044; G06F 3/0608; G06F 3/064; G06F 9/30087; G06F 9/3885; G11C 7/1075
See application file for complete search history.

(56) References Cited

U.S. PATENT DOCUMENTS

| 2002/0052664 | A1 | 5/2002 | Kang et al. |
| 2003/0018862 | A1* | 1/2003 | Karnstedt ............... G06F 5/065 711/156 |
| 2003/0112685 | A1* | 6/2003 | Duh .......................... G06F 5/06 365/221 |
| 2007/0121499 | A1* | 5/2007 | Pal .......................... H04L 45/60 370/230 |
| 2008/0162831 | A1 | 7/2008 | Herz et al. |

(Continued)

Primary Examiner — Hashem Farrokh
(74) Attorney, Agent, or Firm — Patent Portfolio Builders, PLLC

(57) ABSTRACT

A technique for controlling memory accesses of a data stream is provided. The data is streamed between selected ports of a plurality of ports coupled to a memory (110). As to a method aspect of the technique, a pool of ports is selected. The selected ports include a first port (112) and a second port (118) through which data is to be streamed. A portion of the memory (110) is allocated to the pool of ports. The first port (112) is configured for write access to the allocated memory. The second port (118) is configured for read access to the allocated memory. In dependence on a first state indicative of the occurrence of a write access using the first port (112) and a second state indicative of the occurrence of a read access using the second port (118), a further write access using the first port (112) and/or a further read access using the second part (118) is controlled.

17 Claims, 5 Drawing Sheets

(56) References Cited

U.S. PATENT DOCUMENTS

2008/0170460 A1* 7/2008 Oh .................... G11C 8/12
  365/230.05
2012/0166742 A1* 6/2012 Wang ................ H03M 13/2957
  711/154

* cited by examiner

TECHNIQUE FOR CONTROLLING MEMORY ACCESSES

TECHNICAL FIELD

The present disclosure relates to a technique for controlling memory accesses. In particular, and without limitation, the disclosure relates to a technique that controls memory accesses for streaming data between ports providing access to a memory.

BACKGROUND

As the range of functions provided by computing devices increases, more hardware blocks within the device require access to memory resources. Particularly in case of mobile devices, the memory resources should be used efficiently. Connecting each hardware block to a separate memory unit allows parallel memory accesses of the hardware blocks. However, a large amount of rarely used memory has to be provided to fulfil varying memory requirements for each of the hardware blocks at any time.

Sharing memory between the hardware blocks requires less memory, since peak memory allocations to one hardware block can be compensated by less memory requirements of another hardware block. Additionally, shared memory provides a means for exchanging large amount of data between the hardware blocks. Accesses to a shared memory unit are delayed, since a memory access of one hardware block suspends memory accesses of other hardware blocks. Consequently, conventional shared memory is efficient in terms of memory size, but its performance decreases as the number of hardware blocks increases.

A common memory including a plurality of separate memory units, which are accessed in an interleaved manner, combines the advantage of parallel memory accesses due to the plurality of separate memory units with the advantage of efficient memory utilization, because unequal memory requirements of the hardware blocks are balanced by the interleaved access.

While an interleaved control of shared memory provides an example of an efficient memory resource allowing simultaneous memory accesses, such a memory control does not fulfil an increasing demand for streaming data efficiently between hardware blocks. Memory space for a whole data block, which is to be exchanged, needs to be reserved in the memory. The data block then has to be completely written to the memory before it can be read by the receiving hardware unit, which corresponds to an increased latency.

A conventional link for streaming data between a pair of hardware blocks is provided by a two-port First In First Out (FIFO) channel. Memory requirements of the FIFO channel are significantly less than those of shared memory, because a small part of the streamed data has to be stored to the extent the streamed data has been written at one port but has not yet been read by the receiving hardware block at the other port. The FIFO channel further has the advantage of saving data transfer time compared to the shared memory concept, because the receiving hardware block does not have to wait until the data block has been completely written to the memory but can start reading as the data block is still being written to the memory. A further advantage of the FIFO channel is the possibility of data driven control of the receiving hardware block. A drawback of the FIFO channel when compared to the shared memory approach is its lacking flexibility in data routing. The decision which of the plurality of hardware blocks is to be connected via the two-port FIFO channel has to be made at design time. The shared memory approach allows transferring data between all hardware blocks connected to the shared memory.

SUMMARY

Accordingly, there is a need for a technique that allows streaming data more flexibly between hardware blocks in a memory efficient manner.

According to one aspect, a method of controlling memory accesses for a data stream between selected ports of a plurality ports coupled to a memory is provided. The method comprises the steps of selecting a pool of ports including a first port and a second port through which the data is to be streamed, allocating a portion of the memory to the pool of ports, wherein the first port is configured for write access to the allocated memory and the second port is configured for read access to the allocated memory, and controlling, in dependence on a first state indicative of at least the occurrence of a write access using the first port and a second state indicative of at least the occurrence of a read access using the second port, at least one of a further write access using the first port and a further read access using the second port.

In at least some realizations, the pool of ports can be a freely selected subset of the ports. By allocating a portion of the memory to the pool of ports, a link for the data stream using the allocated portion of the memory as a streaming buffer may be provided. Beyond the conventional concept of shared memory allowing block-wise data transfer between ports co-allocated to the same portion of memory, the controlling can provide the full functionality of a First In First Out (FIFO) channel between the first port and the second port in at least some variants.

The pool of ports may be a pair of ports. The method can be applied, at least in some realizations, to simultaneously control memory accesses for a plurality of different data streams, each of which is exchanged between one of a plurality of pools of ports. The pools of ports and/or the number of such pools can be flexibly changed, e.g., during run-time. Each of the ports coupled to the memory may be a bi-directional port. A direction of the memory access may be set for each of the ports. Setting the direction may be part of the selection or the allocation. The direction may include at least one of read access and write access. Each of the writing first port and the reading second port may be selected arbitrarily out of the ports. The first port and the second port may be interchanged, e.g., during run-time. Referring to the pool as a first pool, a second pool of ports may include a third port configured for read access and fourth port configured for write access. All features and steps disclosed for the first pool may also apply to corresponding features and steps of the second pool. The first and third ports may be connectable or connected to a first hardware block. The second and fourth ports may be connectable or connected to a second hardware block. The first and second pools may provide a bi-directional communication between the first hardware block and the second hardware block.

All ports selected for the pool of ports may access the same allocated portion of the memory. The allocated portion of the memory may be defined by a unique starting address. The starting address may define a logical portion of the memory that is distributed over two or more physically separate memory units. The allocated portion may be exclusively allocated to the pool of ports.

The dependence in the controlling step may be represented by a filling level of the allocated memory. The method may further comprise the step of initializing the filling level. The method may further comprise the step of updating the filling level in dependence on the first state and the second state.

The controlling may include at least one of suspending the further read access, if the filling level indicates that the allocated memory is empty, resuming the further read access, if the filling level indicates that the allocated memory is not empty, suspending the further write access, if the filling level indicates that the allocated memory is full, and resuming the further write access, when the filling level indicates that the allocated memory is not full.

The first state may be determined by the first port. The second state may be determined by the second port. The method may further comprise the step of linking the first port and the second port for mutual exchange of the first state and the second state.

Each of the ports of the pool (e.g., the first and second ports) may include a counter indicating the filling level of the allocated portion. The allocating step may include initializing the counters of those ports to which memory is allocated. The counter of the first ports may be updated based on the first state and the exchanged second state from the second port. The counter of the second port may be updated based on the second state and the exchanged first state from the first port. The updating of each of the counters may be triggered by the occurrence of a write access using the first port and/or a read access using the second port. The updating may include incrementing and/or decrementing the counter according to the first and second states.

The exchanged states may further indicate a size of the accessed memory. The updating may further include incrementing and/or decrementing the counter according to the size indicated by the states.

The second port may suspend the further read access, if its counter indicates a lower filling level or an empty allocated portion. The first port may suspend the further write access, if its counter indicates a high filling level or a full allocated portion. A streaming flow control unit may be included in, or associated to, each of the ports in the pool. The streaming flow control unit may include the counter of the respective port. The streaming flow control unit may be adapted to perform the controlling and/or the updating.

The counter of the first port may at least one of be initialized by a size of the allocated portion, be decremented in response to the determined first state, and be incremented in response to the exchanged second state. The counter of the second port may at least one of be initialized by the zero, be incremented in response to the exchanged first state, and be decremented in response to the determined second state.

The flow control unit may suspend the further respective access, if the counter equals zero. The flow control unit may resume the further respective access, if the counter is larger than zero.

Two dedicated units may be provided for the initializing of the counter and the linking of the ports, respectively. Alternatively, a single initializing and linking unit may be provided. The selecting step may include the initializing. The initializing unit may also be referred to as a selecting unit. The functionality of the initializing unit may be provided (e.g., without a centralized initializing unit) by means of a memory access protocol for the memory accesses. The memory access protocol may induce the linking and/or the initializing (e.g., in a decentralized manner at each of the stream flow control units). The memory access protocol may define a communication between the hardware units and the connected or connectable ports. The memory access protocol may define a header structure of data packets communicated to one or more of the ports for each memory access. The header may indicate to the respective port that a mode for data streaming is to be enabled and/or may indicate a size of the allocated portion.

The memory may be configured for simultaneous memory access. Simultaneous memory access may allow memory accesses at different ports within one time slicing cycle of the ports. The memory may include a plurality of physically separate memory units. The separate memory units may be addressed in an interleaved manner or according to a round-robin scheme. Alternatively or in addition, a clocking of the memory may be different from (e.g., higher than) a clocking of the time slicing for the ports.

Different data may be simultaneously streamed between each of a plurality of pools of ports. Each of the pools may include corresponding first and second ports. Using a memory configured for simultaneous memory accesses can provide a guaranteed rate of data streamed through the pool of ports. Using the memory configured for simultaneous memory access can also provide that the streamed data rate does not decrease as a number of pools, through each of which data is streamed, is increased. The technique may thus be scalable.

The pool of ports may further include a third port configured for read access to the allocated memory. The method may thus allow multicasting a stream of data from the first port to each of the second and third ports.

The ports may be connected or connectable to hardware blocks of a mobile communication device. The method may allow streaming data between a selectable pool of the hardware blocks, e.g., without changing a connection between the hardware blocks and the ports.

According to another aspect, a computer program product is provided. The computer program product comprises code portions for performing one or more of the steps of the method described herein when the computer program product is executed on one or more computing devices. The computer program product may be stored on a computer-readable recoding medium such as a permanent or re-writeable memory. The computer program product may also be provided for download via one or more computer networks such as the Internet, a cellular telecommunications network, or a wireless or wired Local Area Network (LAN).

As for a hardware aspect, an apparatus for controlling memory accesses for a data stream between selected ports of a plurality of ports coupled to memory is provided. The apparatus comprises a selecting unit adapted to select a pool of ports including a first port and a second port through which data is to be streamed, an allocating unit adapted to allocate a portion of the memory to the pool of ports, wherein the first port is configured for write access to the allocated memory and the second port is configured for read access to the allocated memory, and a controlling unit adapted to control, in dependence on a first state indicative of at least the occurrence of a write access using the first port and a second state indicative of at least the occurrence of a read access using the second port, at least one of a further write access using the first port and a further read access using the second port.

The apparatus may further comprise a crossbar switch adapted to selectively link the first port and the second port for mutual exchange of the first state and the second state.

The memory may include a plurality of physical memory banks and a memory access control unit. The memory access control unit may be adapted to apply or address memory accesses of each of the one or more pools and one or more ports not selected in any pool to different memory banks in an interleaved manner.

A dedicated streaming flow control unit may be provided for each port of the plurality of ports. The streaming flow control unit of each port may be adapted to perform the functionality of the controlling unit in relation to the respective one of the ports. The selecting unit may further be adapted to enable the streaming flow control units dedicated to the ports selected for the pool of ports.

The selecting unit may further be adapted to close a data stream through the pool of ports by at least one of configuring the ports of the pool to independently access the memory, to release the link between the first and second ports for mutual exchange of the first and second states, and to disable the streaming flow control units dedicated to the ports of the pool.

The above-mentioned units or additional units of the apparatus may be further adapted to perform one or more of the steps mentioned in the context of the method aspects.

BRIEF DESCRIPTION OF THE DRAWINGS

In what follows, further details and advantages of the disclosure are described with reference to exemplary embodiments illustrated in the drawings, wherein FIG. 1 schematically illustrates a block diagram of a mobile communication device including an apparatus for controlling memory accesses for a data stream between selected ports of a plurality of ports coupled to memory.

DETAILED DESCRIPTION

In the following, for purposes of explanation and not limitation, specific details are set forth, such as particular sequences of steps, components and configurations in order to provide a thorough understanding of the present disclosure. It will be apparent to a person skilled in the art that the disclosure may be practiced in other embodiments that depart from these specific details. For example, while the embodiment are described with reference to a mobile communication device, it will be appreciated by the skilled person that the disclosure can also be practiced in the context of a base station of a mobile telecommunications network or any other component of a computing system requiring efficient memory access.

Moreover, those skilled in the art will appreciate that services, functions, logic components or steps explained herein may be implemented using software functioning in conjunction with a programmed microprocessor or using an Application Specific Integrated Circuit (ASIC), a Digital Signal Processor (DSP) or a general purpose computer. It will also be appreciated that, while the following embodiments are described in the context of method and devices, the technique presented herein may also be embodied in a computer program product as well as a in a system comprising a computer processor and a memory coupled to the processor, wherein the memory is encoded with one or more programs configured to execute the services, functions, logic components or steps disclosed herein.

Figure 1:
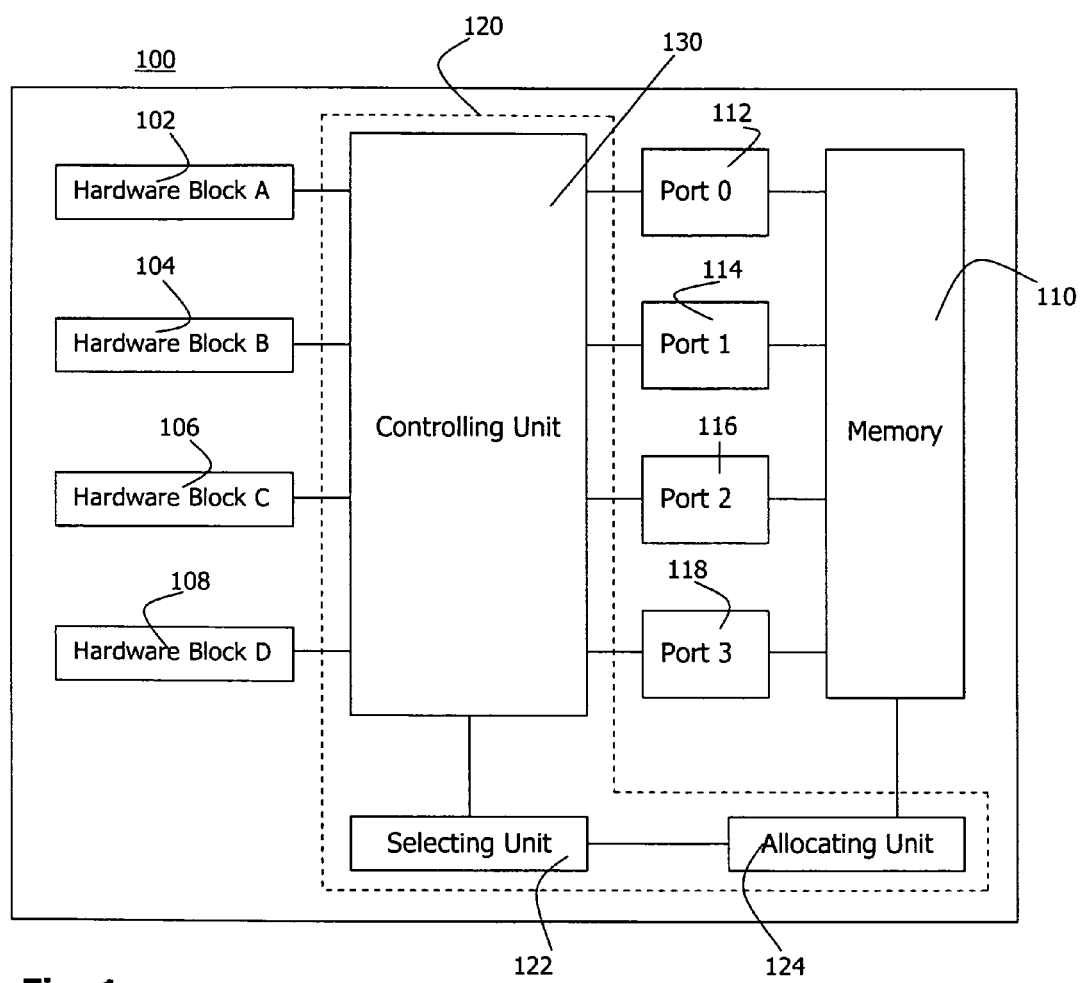

FIG. 1 schematically illustrates an embodiment of a mobile communication device 100 including a plurality of hardware blocks 102 to 108 and a memory 110 providing simultaneous access via a plurality of ports 112, 114, 116, 118 in one-to-one connection to the hardware blocks 102, 104, 106, 108.

The mobile communication device 100 further includes a first embodiment of an apparatus 120 for controlling memory accesses for a data stream between selected ports of a plurality of ports coupled to memory. In the example of the mobile device 100, the apparatus 120 controls the memory accesses of a data stream between selected ports 112 and 118 of the plurality of ports 112 to 118 coupled to the memory 110.

The device includes a selecting unit 122, an allocating unit 124 and a controlling unit 130. The selecting unit 122 defines at least one pool of ports for streaming data. Each pool includes two or more ports selected out of the plurality of ports 112 to 118 through which the data is to be streamed. Since the memory 110 allows simultaneous memory accesses at the ports 112 to 118, different data can be simultaneously streamed in different pools, in case different pools coexist. The allocating unit 124 allocates a portion of the memory 110 to each pool of selected ports. The allocated portion of the memory functions as a streaming buffer for the data streamed in the pool. The controlling unit 130 controls memory accesses of the hardware blocks 102 and 108 connected to ports 112 and 118 of the pool depending on states indicative of one or more previous memory accesses to the memory 110.

Figure 2:
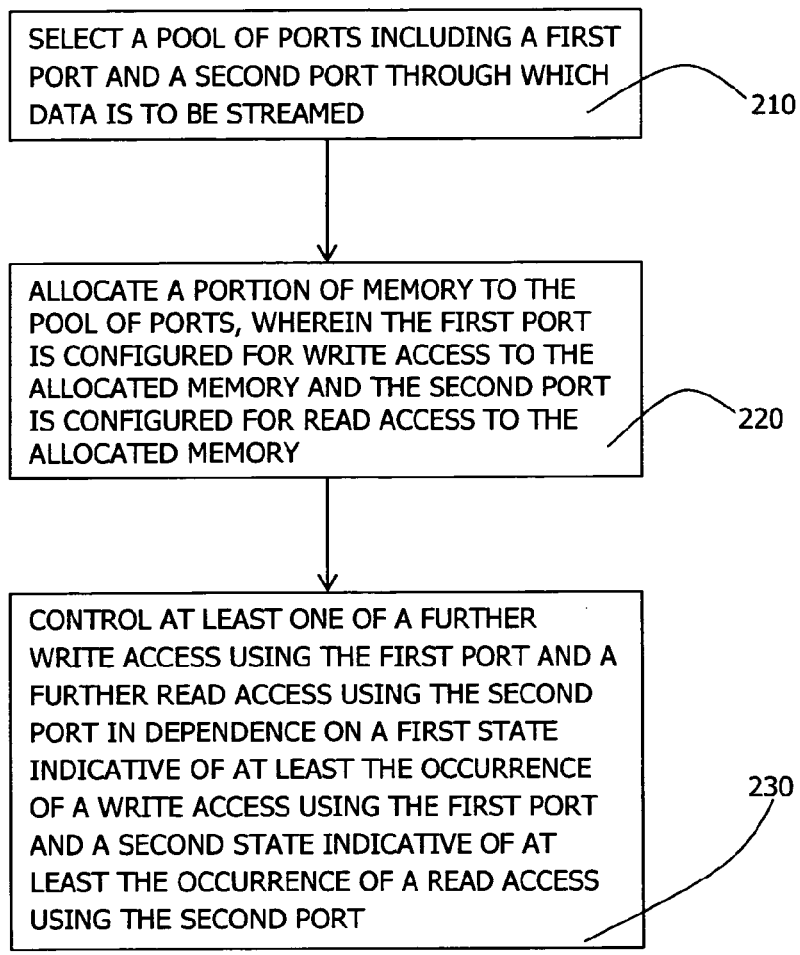
FIG. 2 shows a flowchart of a method of controlling memory accesses for a data stream between selected ports of a plurality of ports coupled to memory, which method is performed by the apparatus of FIG. 1.

The operation of the apparatus 120 is shown by means of a flow chart in FIG. 2. The flow chart shows and embodiment of a method 200 of controlling memory accesses for a data stream between selected ports of a plurality of ports coupled to memory.

The method 200 includes a step 210 of selecting a pool of ports including a first port 112 and a second port 118 through which data is to be streamed. The method 200 further includes a step 220 of allocating a portion of the memory 110 to the pool of ports, wherein the first port 112 is configured for write access to the allocated memory and the second port 118 is configured for read access to the allocated memory. In a step 230 of the method 200, at least one of a further write access via the first port 112 and a further read access via the second port 118 is controlled in dependence on a first state indicative of at least the occurrence of a write access via the first port 112 and a second state indicative of at least the occurrence of a read access via the second port 118. The steps 210, 220 and 230 of the method 200 can be performed by the units 122, 124 and 130 of the apparatus 120, respectively.

Figure 3:
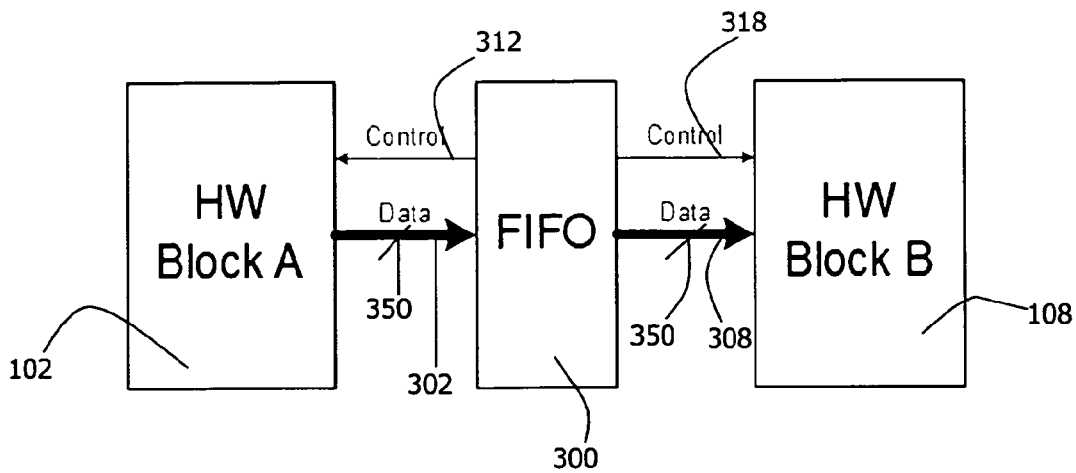
FIG. 3 schematically illustrates a functional relation between a pair of the hardware blocks shown in FIG. 1 as the result of the method of FIG. 2 performed by the apparatus of FIG. 1.

FIG. 3 schematically illustrates a First In First Out (FIFO) channel 300 as a result of the apparatus 120 performing the method 200 from a functional point of view. The connection between the hardware blocks 102 and 108 and the controlling unit 130 includes a data 302 and 308, respectively. Data 350 is streamed via the data lines 302 and 308 according to the configuration of the ports 112 and 118 for write and read accesses, respectively. The connection between the hardware blocks 102 and 108 and the ports 112 and 118 further includes feedback lines 312 and 318 for signaling halt and resumption of the data transfer to the hardware blocks 102 and 108.

Figure 4:
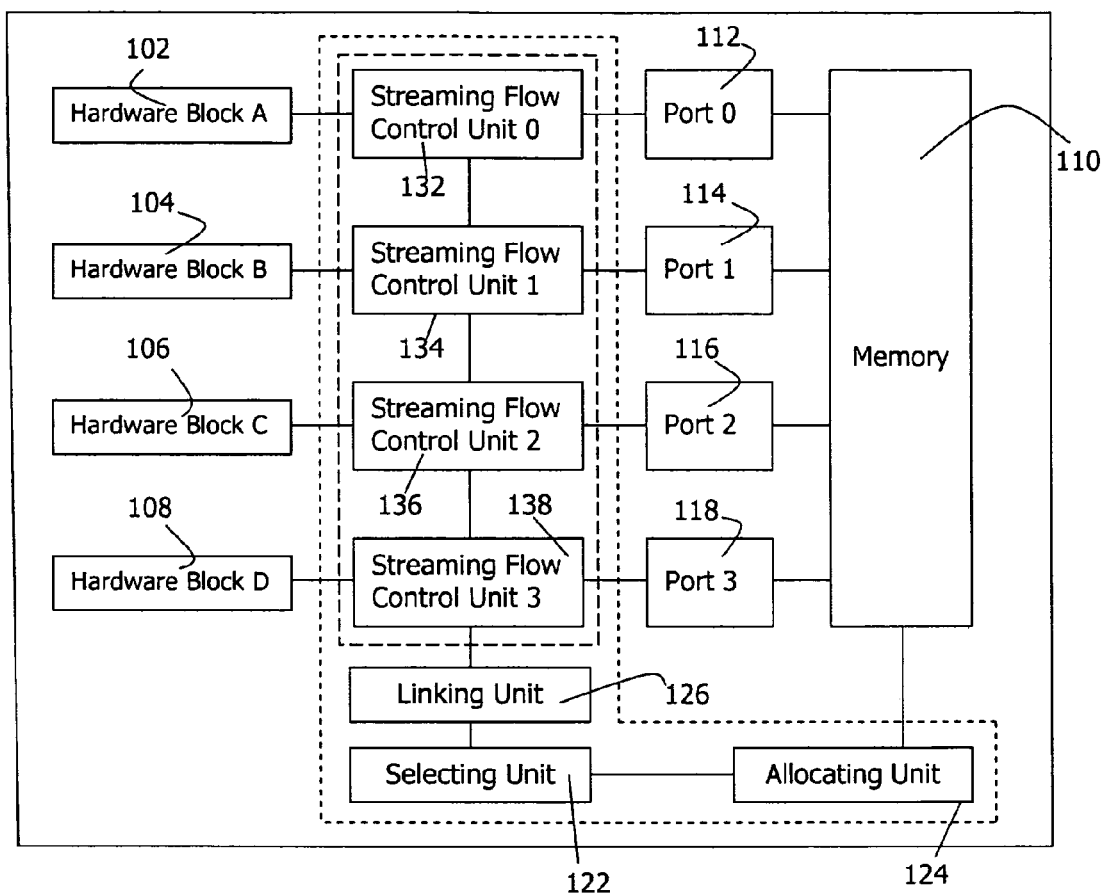
FIG. 4 schematically illustrates a block diagram of another mobile communication device including an apparatus for controlling memory accesses for a data stream between selected ports of a plurality of ports coupled to memory.

FIG. 4 schematically illustrates a mobile device 400. The mobile device 400 includes a second embodiment of a device for controlling memory accesses for a data stream between selected ports of a plurality of ports coupled to memory. Like reference signs indicate components corresponding to those described above with reference to FIG. 1.

The second embodiment of the apparatus 120 only differs from first embodiment, as described above with reference to FIG. 1, in that dedicated streaming flow control units 132 to 138 are arranged in one-to-one association with the ports 112 to 118. Some or all of the streaming flow control units can be arranged at or inside the associated one of the ports 112 to 118. The functionality of the controlling unit 130 is thus distributed to a plurality of streaming flow control units 132 to 138. Each of the streaming flow control units 132 to 138 is adapted to control the memory accesses that use the associated one of the ports 112 to 118.

States indicative of the occurrence of a memory access are provided by the streaming flow control unit of the port, via which the memory 110 is accessed. The streaming flow control units 132 and 134 associated to the ports 112 and 118 defining one pool of ports for the streaming of the data 350 are mutually linked for exchanging their respective states indicative of the occurrence of a memory access by a linking unit 126. Each of the streaming flow control units belonging to the same port of pools thus receives the states from all other streaming flow control units. Based on its own state and the one or more states received from the at least one other streaming flow control unit, each of the streaming flow control units 132 and 138 autonomously controls further memory accesses via its associated port.

Figure 5:
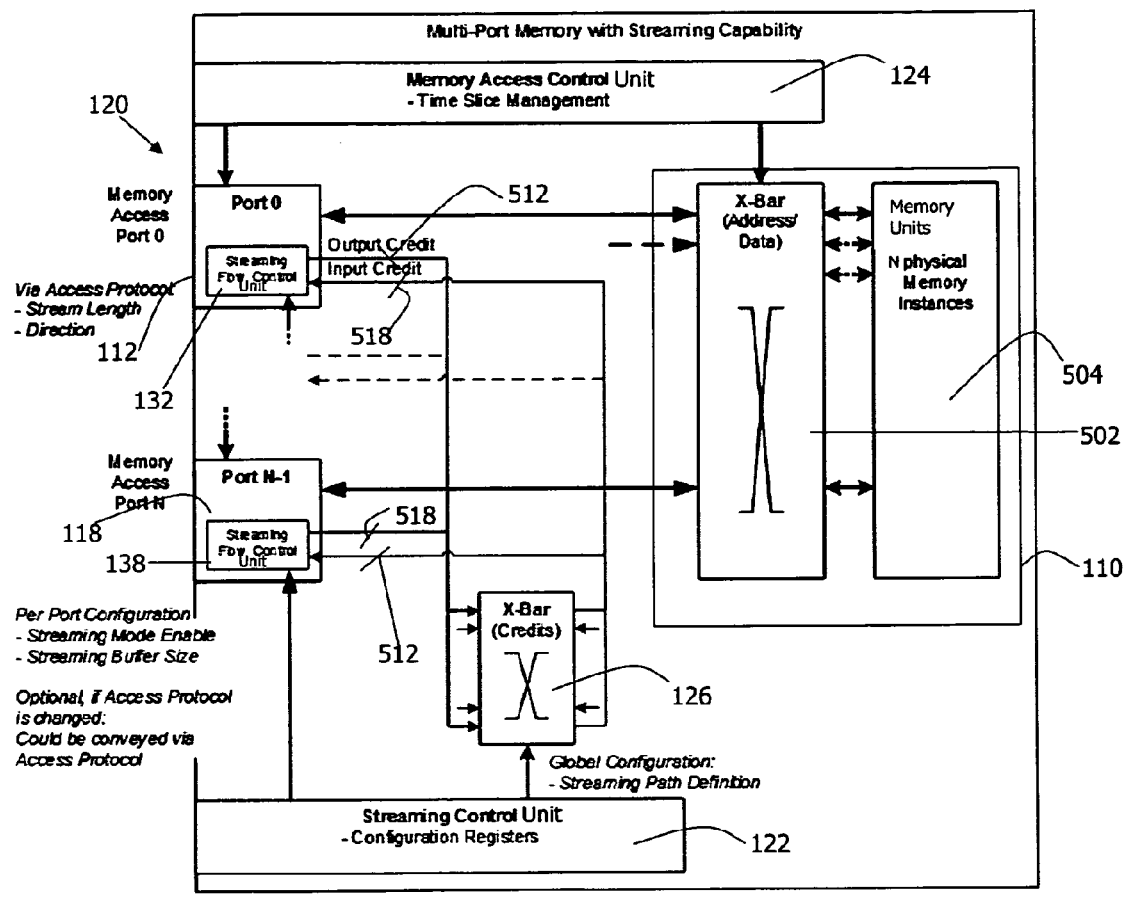
FIG. 5 schematically illustrates a more detailed block diagram of the apparatus of FIGS. 1 and 4 coupled to memory.

FIG. 5 schematically illustrates further details of the memory 110 and the apparatus 120 connected to the memory 110. Each of the details can be implemented in the context of the first embodiment shown in FIG. 1 and/or the second embodiment shown in FIG. 4. The apparatus 120 operatively coupled to the memory 110 can be considered as an extended multi-port memory 500 providing data streaming capability.

The streaming flow control units 132 to 138 are integrated in the associated one of the ports 112 to 118. The allocating unit 124 includes a memory access control unit coupled to each of the ports 112 to 118 and to the memory 110. The memory includes a data crossbar switch 502 and a plurality of memory units 504. There are N memory units corresponding to the total number N of ports 112 to 118 (i.e., including both ports defining a pool of ports for streaming data and ports not selected for any pool). The data crossbar switch 502 connects each of the ports 112 to 118 to a different one of the memory units 504. There is a bijective relation defined by the data crossbar switch 502 between the set of ports 112 to 118 and the set of memory units 504.

The memory access control unit included in the allocating unit 124 controls the data crossbar switch 502 and thus defines the bijective relation between the ports 112 to 118 and the memory units 504 as a function of time. The memory access control unit 124 synchronously sets the data crossbar switch 502 and triggers the memory accesses of the plurality of ports 112 to 118 according to a time slice management (as is indicated by vertical arrows pointing downwards in FIG. 5). In each memory access of one of the ports 112 to 118, one data word is either written to or read from the memory 110. The memory access control unit 124 controls the data crossbar switch 502 so that consecutive memory accesses via the same port are distributed among the memory units 504 in a round-robin scheme. Typically, the hardware block 102 writes a burst including a plurality of words via the port 112, so that the first word of the burst is written to the first memory unit of the memory units 504, the second word of the same burst from the hardware block 102 is written to the second memory unit, etc. As a result, the memory 110 efficiently distributes the available storage capacity of the memory units 504 to the hardware blocks 102 to 108 via the respective ports 112 to 118. All hardware blocks 102 to 108 can access, i.e., read to or write from, the memory 110 simultaneously, because each of the simultaneous memory accesses is directed by means of the data crossbar switch 502 to a physically separate one of the memory units 504. Simultaneously may thus mean that, via each of the ports 112 to 118, one word can be either read or written within the same cycle of the time slice management.

The multi-port memory 500 allows the hardware blocks 102 to 108 to use the memory 110 either as private memory accessible only to one of the hardware blocks or to selectively define the pool of ports through which data is to be streamed using the portion of the memory 110 allocated to the pool as a streaming buffer. The communication between the hardware blocks 102 to 108 and the ports 112 to 118 is structured in data packets.

Figure 6:
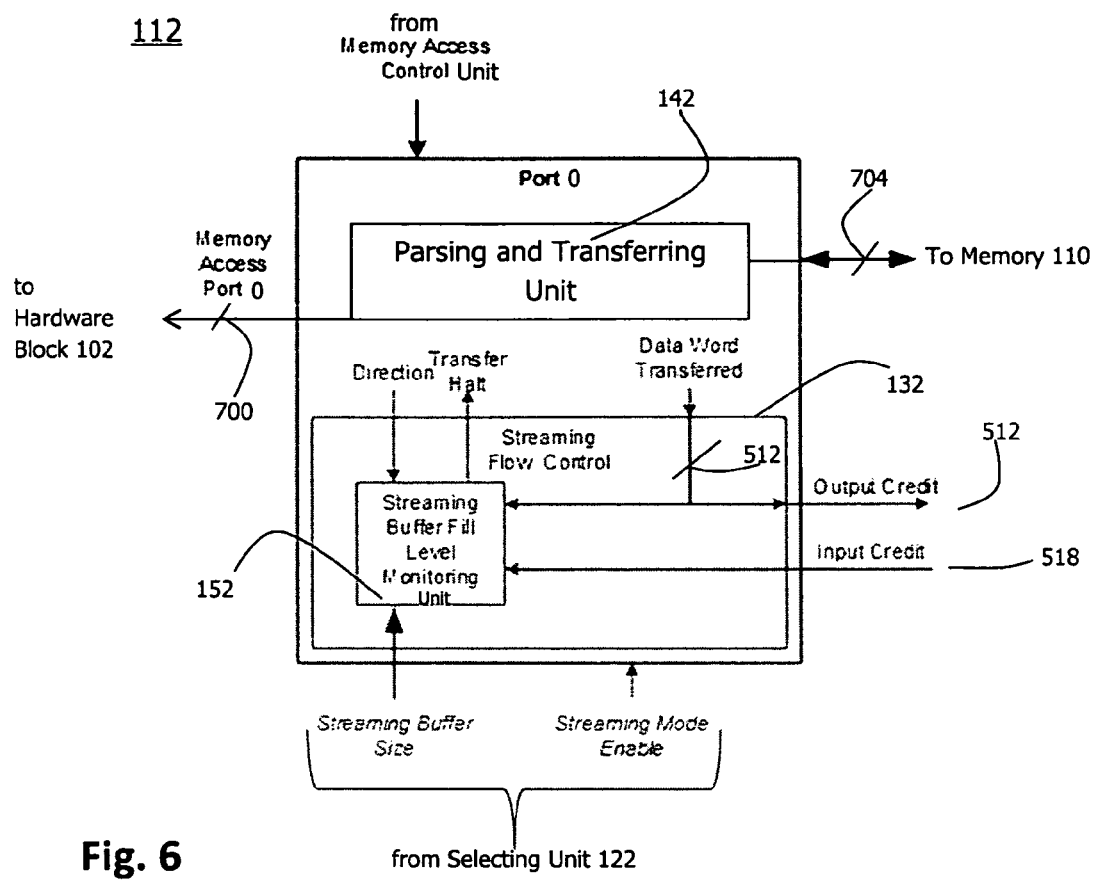
FIG. 6 schematically illustrates further details of a streaming flow control unit included in the apparatus shown in each of the FIGS. 1 and 4.
Figure 7:
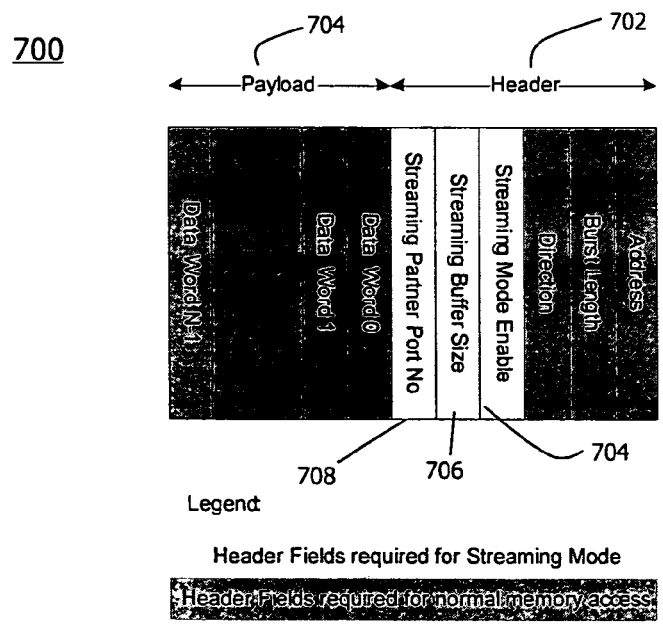
FIG. 7 illustrates a header structure of a memory access protocol for communication between hardware blocks and ports shown in each of the FIGS. 1 and 4.

FIG. 6 shows further details of the port 112 including a passing and transferring unit 142 adapted to process a data packet 700 schematically illustrated in FIG. 7. The processing includes passing a header 702 of the data packet 700 and transferring payload 704 of the data packet 700 to the memory 110. The header fields shown with dark shaded background are included in the header 702 in the case of private memory access as well as for streaming data. The header field "Address" is a pointer uniquely identified a starting address in the memory 110. The header field "Burst Length" corresponds to the number of data words included in the payload 704. The header field "Direction" defines whether the payload 704 is to be written to the memory 110 starting at the starting address or is to be read from the memory 110 starting at the starting address.

In a first variant of the multi-port memory 500 only the dark shaded header fields are required for steaming data. The selecting unit 122 is implemented by a streaming control unit including configuration registers. The linking unit 126 is implemented by a control crossbar switch. The ports defining the pool of ports for streaming data are selected by configuring the configuration registers of the streaming control unit implementing the selecting unit 122. The configuration registers include for each of the ports 112 to 118 a streaming mode enabling bit, a streaming buffer size and a pool identifier. The configuration registers of ports belonging to the same pool of ports include the same pool identifier. In an exemplary implementation, the pool identifier also functions as the streaming mode enabling bit, wherein a pool identifier equal to zero indicates that the streaming mode is disabled for the corresponding one of the ports 112 to 108, whereas a pool identifier larger than zero indicates that the streaming mode is enabled.

The streaming control unit implementing the selecting unit 122 in the first variant of the multi-port memory 500 shown in FIG. 5 globally configures the control streaming path by means of the control crossbar switch implementing the linking unit 126 and enables the streaming mode for each of the ports 112 and 118 in the pool of ports for streaming the data 350.

The streaming control unit implementing the selecting unit 122 configures the control crossbar switch implementing the linking unit 126 so that the first state 512 provided by the streaming flow control unit 132 of the first port 112 is provided to the at least one streaming flow control unit 138 of all other ports belonging to the same pool of ports. In the example shown in FIG. 5, the first state 512 is provided to the streaming flow control unit 138 of the port 118 via the control crossbar switch 126. The streaming flow control unit 138, in turn, provides its second state 518 via the control crossbar switch 126 to the streaming flow control unit 132 of the first port 112.

Each of the streaming flow control units 132 to 138 includes a streaming buffer fill level monitoring unit 152, as is shown in FIG. 6 for the example of the first port 112. A counter for representing the filling level of the allocated memory is included in each of the streaming buffer fill level monitoring units 152. The streaming control unit implementing the selecting unit 122 is further adapted to configure the streaming flow control units 132 and 138 of all ports 112 and 118 selected for the pool of ports. The streaming flow control units 132 and 138 are enabled, their counters included in the respective streaming buffer fill level monitoring unit 152 is initialized, and the streaming buffer size (i.e., the size of the allocated memory) is provided to the streaming buffer fill level monitoring unit 152 by the selecting unit 122.

As a result, when the hardware block 102 sends a data packet 700 (only including the dark shaded header fields in the first variant), the parsing and transferring unit 142 queues the payload 704 of the burst corresponding to the data packet 700. In accordance with the time slicing management controlled by the memory access control unit 124, the payload 704 is written starting at the starting address word by word in each time slicing cycle. The payload 704 is thus part of the data 350 streamed from the hardware block 102 along the FIFO channel 300 provided by the multi-port memory 110 and controlled by the apparatus 120.

Whenever one data word is transferred by the streaming flow control unit 132, the first state 512 is provided to the local streaming buffer filling level monitoring unit 152 as well as to the at least one other streaming flow control unit 138 of the at least one further port 118 included in the same pool of ports via the linking unit 126. The counter indicating the filing level of the allocated memory in the streaming buffer fill level monitoring unit 152 is updated in response to the first state 512 indicative of a write access so that the counter represents the updated filing level increased by one data word.

The streaming buffer fill level monitoring unit 152 decreases the filling level represented by its counter by one data word in response to the second state 518 indicating a read access at the at least one other port 118 belonging to the pool of ports. As a result, the streaming flow control unit 132 includes a counter representing the current filling level of the allocated portion of the memory functioning as the streaming buffer. Based on the streaming buffer size initially provided by the streaming control unit implementing the selecting unit 122 and the current filling level, the streaming flow control unit 132 provides either a transfer halt signal or a transfer resume signal to the parsing and transferring unit 142, which suspends and resumes the memory accesses of the queued payload 704 accordingly.

While the streaming flow control unit 132 for the first port 112 has been described with reference to FIG. 6, corresponding streaming flow control units 134 to 138, each of which includes a counter representing the current filling level whenever the streaming mode is enabled, are provided for each of the ports 114 to 118.

In an exemplary implementation, the counter of the flow control unit 132 is initialized by the streaming buffer size as the first port 112 is configured for write accesses to the allocated memory. A counter equal to the streaming buffer size thus represents an empty streaming buffer in the case of the port 112 configured for write accesses. In response to the locally provided first state 512, the counter in the streaming buffer fill level monitoring unit 152 is decreased by one. In response to the reception of the second state 518, the counter is increased by the streaming buffer fill level monitoring unit 152. When the counter is equal to zero, the streaming buffer fill level monitoring unit 152 signals the transfer halt signal to the parsing and transferring unit 142. Whenever the counter is larger than zero, the streaming buffer fill level monitoring unit 152 of the streaming flow control unit 132 signals the transfer resume signal to the parsing and transferring unit 142.

Similarly, the streaming flow control unit 138 of the second port 118 includes a streaming buffer fill level monitoring unit including a counter representing the filling level of the commonly allocated portion of the memory 110. While all counters of the streaming flow control units 132 and 138 represent the same filling level, different streaming flow control units may implement different numerical representation of the filling level. For example, the second port 118 configured for read access to the allocated memory can use a different numerical representation compared to the port 112 configured for write access. In an exemplary implementation, the counter associated to the second port 112 is initialized by zero indicating that the allocated memory including the streaming buffer is empty. In response to the reception of the first state 512 from the streaming flow control unit 132 of the first port 112, the counter is decreased by one. In response to the locally provided second state 518 the counter is increased by one. As a result, the local counter included in the streaming flow control unit 138 of the second port 118 indicates the current filling level of the streaming buffer in terms of data words. Read accesses for reading the payload 704 from the commonly allocated portion of the memory 110 are suspended in response to the transfer halt signal provided by the streaming flow control unit 138 whenever its counter equals zero. Otherwise, one data word is read from the allocated memory in each time slicing cycle.

In a second variant, the global streaming control unit (which implements the selecting unit 122 in the first variant) is avoided. The memory access protocol defining the communication between hardware blocks 102 to 108 and the connected ports 112 to 118 is extended to include header fields providing the information that is included in the configuration registers of the streaming control unit in the first variant. The additional header fields are indicated by light shaded backgrounds in FIG. 7. The parsing and transferring unit 142 included in each of the ports 112 to 118 is further configured to process the received data blocks 700 according to the additional header fields. The functionality of the selecting unit 122 is thus implemented by the parsing and transferring unit 142.

The additional header field "Streaming Mode Enable" 704 includes a bit, which is set to indicate that the data packet 700 relates to streaming data 350. In response to the bit set in the header field 704, the parsing and transferring units 142 enables the streaming flow control unit 132 and queues the payload 704 for write access to the allocated portion of the memory. The streaming buffer fill level monitoring unit 152 is provided with the Streaming Buffer Size in the header field 706. The parsing and transferring unit 132 further configures the linking unit 126 for mutual exchange of the first and second states 512 and 518 provided by the streaming flow control unit 132 of the port 112 receiving the data packet 700 and the streaming flow control unit 138 of the port 118 indicated in the additional header field "Streaming Partner Port No." 708.

As a result of the configuration in accordance with the additional header fields 704 to 708, the streaming flow control units 132 and 138 of those ports selected for the pool of ports for streaming the data 350 control the memory accesses via the ports 112 and 118 of the pool, as described above in the context of the first variant.

As has become apparent, at least some of above embodiments allow reusing a memory accessible via a plurality of ports to achieve the functionality of a FIFO channel that can be selectively established and released between a pair of ports or a larger pool of ports including more than one port configured for read accesses. Such a larger pool can provide the functionality of multi-casting the data input at one port configured for write access and output at a plurality of ports configured for read access.

From a functional point of view, the technique can establish a FIFO streaming channel between freely selected ports. A latency of the streaming achievable by the present technique may be less than the delay in exchanging the same amount of data entirely written into the shared memory by one hardware block prior to reading the data by another hardware block.

At least some implementations of the technique are memory efficient. Less memory has to be allocated for the selectable streaming as compared to the memory requirements for exchanging data blocks via shared memory. Additionally, the memory requirements for controlling the memory accesses substantially include, in some embodiments, the counters for autonomously representing the filling level of the streaming buffer and the configuration registers holding the starting address and the streaming buffer size. As a result, the additional memory requirements for controlling the memory accesses are almost neglectable (e.g. compared to the size and complexity of the multi-port memory that has to be provided for private memory accesses of the hardware blocks). Thus, at least some of the embodiments elegantly and cost-effectively extend the multi-port memory to provide a flexible streaming capability.

As will be recognized by those skilled in the art, the features described herein can be modified and varied over a wide range of applications. Accordingly, the scope of patented subject-matter should not be limited to any of the specific exemplary teachings discussed above but is defined by the following claims.

The invention claimed is:

1. A method of controlling memory accesses for a data stream between selected ports of a plurality of ports coupled to a memory, the method comprising:

selecting a pool of ports including a first port and a second port through which data is to be streamed;

allocating a portion of the memory to the pool of ports, wherein the first port is configured for write access to the allocated portion of the memory and the second port is configured for read access to the allocated portion of the memory; and controlling, in dependence on a first state indicative of at least an occurrence of the write access using the first port and a second state indicative of at least an occurrence of the read access using the second port, at least one of a further write access using the first port and a further read access using the second port, wherein the first and the second ports are connected or connectable to hardware blocks of a mobile communication device so that the data is streamed between a selectable pool of the hardware blocks without changing a connection between the hardware blocks and the first and the second ports.

2. The method of claim 1, wherein the dependence is represented by a filling level of the allocated portion of the memory, and the method further comprises:

initializing the filling level; and updating the filling level in dependence on the first state and the second state.

3. The method of claim 2, wherein the controlling includes at least one of:

suspending the further read access when the filling level indicates that the allocated portion of the memory is empty;

resuming the further read access when the filling level indicates that the allocated portion of the memory is not empty;

suspending the further write access when the filling level indicates that the allocated portion of the memory is full; and resuming the further write access when the filling level indicates that the allocated portion of the memory is not full.

4. The method of claim 2, wherein the first state is determined by the first port and the second state is determined by the second port, the method further comprises:

linking the first port and the second port for mutually exchanging the first state and the second state.

5. The method of claim 4, wherein each of the first and the second ports includes a counter indicating the filling level of the allocated portion of the memory.

6. The method of claim 5, further comprising at least one of:

updating the counter of the first port based on the first state and the exchanged second state from the second port; and updating the counter of the second port based on the second state and the exchanged first state from the first port.

7. The method of claim 6, wherein the exchanged states are further indicative of a size of the memory.

8. The method of claim 6, wherein the second port suspends the further read access when the counter of the second port indicates a low filling level or an empty allocated portion of the memory, and wherein the first port suspends the further write access when the counter of the first port indicates a high filling level or a full allocated portion of the memory.

9. The method of claim 6, wherein the counter of the second port is at least one of initialized by zero, incremented in response to the exchanged first state, and decremented in response to the determined second state.

10. The method of claim 6, wherein the counter of the first port is at least one of initialized by a size of the allocated portion of the memory, incremented in response to the exchanged second state, and decremented in response to the determined first state.

11. The method of claim 1, wherein the memory is configured for simultaneous memory access.

12. The method of claim 1, wherein different data is simultaneously streamed between each of a plurality of pools of ports, each of the pools including corresponding first and second ports.

13. The method of claim 1, wherein the pool of ports further includes a third port configured for read access to the allocated portion of the memory.

14. A non-transitory computer-readable medium for storing a computer program product comprising program code portions that, when executed on a computing device, configure the computing device to control memory accesses for a data stream between selected ports of a plurality of ports coupled to a memory, said computer program code portions including program instructions to configure the computing device to:
  select a pool of ports including a first port and a second port through which data is to be streamed;
  allocate a portion of the memory to the pool of ports, wherein the first port is configured for write access to the allocated portion of the memory and the second port is configured for read access to the allocated portion of the memory; and
  control, in dependence on a first state indicative of at least an occurrence of the write access using the first port and a second state indicative of at least an occurrence of the read access using the second port, at least one of a further write access using the first port and a further read access using the second port,
  wherein the first and the second ports are connected or connectable to hardware blocks of a mobile communication device so that the data is streamed between a selectable pool of the hardware blocks without changing a connection between the hardware blocks and the first and the second ports.

15. An apparatus for controlling memory accesses for a data stream between selected ports of a plurality of ports coupled to a memory, the apparatus comprising a processing circuit operatively associated with the memory and configured to:
  select a pool of ports including a first port and a second port through which data is to be streamed;
  allocate a portion of the memory to the pool of ports, wherein the first port is configured for write access to the allocated portion of the memory and the second port is configured for read access to the allocated portion of the memory; and
  control, in dependence on a first state indicative of at least an occurrence of the write access using the first port and a second state indicative of at least an occurrence of the read access using the second port, at least one of a further write access using the first port and a further read access using the second port,
  wherein the apparatus further comprises a crossbar switch adapted to selectively link the first port and the second port for mutually exchanging the first state and the second state.

16. The apparatus of claim 15, wherein the memory includes a plurality of physical memory banks and the apparatus includes a memory access control circuit that is adapted to apply memory accesses of each of the pool and ports not selected in a pool to different memory banks in an interleaved manner.

17. The apparatus of claim 15, wherein the apparatus includes dedicated streaming flow control circuit for each port of the plurality of ports, and wherein the processing circuit is further adapted to enable the streaming flow control circuits dedicated to the ports selected for the pool.

* * * * *